(12) United States Patent
Baur et al.

(10) Patent No.: US 6,591,754 B1
(45) Date of Patent: Jul. 15, 2003

(54) PYROTECHNICAL IGNITION SYSTEM WITH INTEGRATED IGNITION CIRCUIT

(75) Inventors: Richard Baur, Pfaffenhofen (DE); Guenter Fendt, Schrobenhausen (DE); Hermann Kueblbeck, Schrobenhausen (DE); Horst Laucht, Bruckmuehl (DE); Alfons Woehrl, Schrobenhausen (DE)

(73) Assignees: DaimlerChrysler AG, Stuttgart (DE); TRW Airbag System GmbH & Co. KG, Aschau (DE)

( * ) Notice: Subject to any disclaimer, the term of this patent is extended or adjusted under 35 U.S.C. 154(b) by 0 days.

(21) Appl. No.: 09/645,260

(22) Filed: Aug. 24, 2000

(30) Foreign Application Priority Data

Aug. 25, 1999 (DE) .......................... 199 40 201
Aug. 25, 1999 (DE) .......................... 199 40 200

(51) Int. Cl.⁷ ............................................. F42C 21/00
(52) U.S. Cl. ..................................... 102/206; 102/207
(58) Field of Search ................................. 102/206, 207

(56) References Cited

U.S. PATENT DOCUMENTS

| | | | | |
|---|---|---|---|---|
| 4,819,560 A | | 4/1989 | Patz et al. ................ | 102/202.5 |
| 5,029,529 A | * | 7/1991 | Mandigo et al. ......... | 102/202.9 |
| 5,200,574 A | * | 4/1993 | Cunnigham et al. ...... | 102/530 |
| 5,334,025 A | * | 8/1994 | Föhl ........................... | 439/188 |
| 5,634,660 A | * | 6/1997 | Fink et al. ................... | 280/741 |
| 5,847,309 A | * | 12/1998 | Baginski ..................... | 102/202.2 |
| 5,889,228 A | * | 3/1999 | Ewick et al. ................. | 102/275.5 |
| 6,070,531 A | * | 6/2000 | Hansen et al. .............. | 102/202.5 |
| 6,192,802 B1 | * | 2/2001 | Baginski ..................... | 102/202.2 |
| 6,227,115 B1 | * | 5/2001 | Gruber et al. ............. | 102/202.14 |
| 6,272,965 B1 | * | 8/2001 | Baginski et al. ............ | 86/1.1 |
| 6,289,813 B1 | * | 9/2001 | Dugurt et al. ............ | 102/202.5 |
| 6,302,024 B1 | * | 10/2001 | Swart et al. ............. | 102/202.5 |

FOREIGN PATENT DOCUMENTS

| | | |
|---|---|---|
| DE | 3537820 | 4/1987 |
| DE | 3717149 | 11/1987 |
| DE | 19610799 | 9/1997 |

(List continued on next page.)

OTHER PUBLICATIONS

An Article entitled: "An Introduction to Semiconductor Initiation of Electroexplosive Devices", K.E. Willis, $2^{nd}$ International Symposium on Sophisticated Car Occupant Safety Systems, Airbag 2000, Karlsruhe, Germany, 1994, pp. 42–1 to 42–9.

Primary Examiner—Michael J. Carone
Assistant Examiner—Denise Buckley
(74) Attorney, Agent, or Firm—W. F. Fasse; W. G. Fasse

(57) ABSTRACT

A pyrotechnical ignition system with integrated ignition circuit for an occupant restraint system for motor vehicles includes electrical components for triggering or communication functions integrated therein, a capacitor arrangement, having a flat non-conductive external surface is used as a substrate or carrier element on which the other components are directly arranged and carried. A conductor structure linking the components can be formed by insertable metal parts that are arranged in the housing and project into the holding chamber in which the capacitor arrangement and the circuit component are arranged, and make contact with contact zones on the upper side of the circuit or the capacitor arrangement. The conductor structure may be a printed-conductor structure that is precipitated on non-conductive external surfaces of the capacitor arrangement, and the lateral surfaces thereof, connect the upper and the lower sides of the ignition capacitor as well as the individual capacitor electrodes within the capacitor arrangement to form one or several capacitors, in particular the ignition capacitor. The ignition bridge layer is situated on the capacitor arrangement or on the circuit.

37 Claims, 6 Drawing Sheets

FOREIGN PATENT DOCUMENTS

| | | |
|---|---|---|
| DE | 19653115 | 6/1998 |
| DE | 19836278 | 3/2000 |
| DE | 19846110 | 4/2000 |
| DE | 19836280 | 5/2000 |
| DE | 19945790 | 5/2000 |
| EP | 0555651 | 8/1993 |

* cited by examiner

PYROTECHNICAL IGNITION SYSTEM WITH INTEGRATED IGNITION CIRCUIT

PRIORITY CLAIM

This application is based on and claims the priority under 35 U.S.C. §119 of German Patent.Applications 199 40 200.0 and 199 40 201.9, both filed on Aug. 25, 1999, the entire disclosure of which is incorporated herein by reference.

FIELD OF THE INVENTION

The invention relates to a pyrotechnic ignition system with an integrated ignition circuit, especially for triggering or activating an occupant restraint system in a vehicle.

BACKGROUND INFORMATION

Pyrotechnical ignition systems are used in particular for triggering occupant restraint systems, but in principle they can also be used for military applications or in mining. A pyrotechnical fuel or explosive charge is ignited by releasing energy from an igniter. This energy is supplied electrically in the form of an ignition voltage which is generated and/or stored in an integrated ignition circuit by means of electrical components.

An ignition system of this kind, for example, is described in German Patent Document DE 37 17 149 C3 where it is described under the term detonator ignition element. Here too, electrical components are used, in particular an electronic circuit which includes an overvoltage protector, a communications unit, a timer and interlock circuit, as well as a self-test module. For storing energy, an ignition capacitor is used which, because of its size, is not integrated in the circuit but provided as a separate component.

In ignition systems with integrated ignition circuits without an ignition capacitor, as for example presented in the article by Willis, K.: An Introduction to Semiconductor Initiation of Electroexplosive Devices, in; 2nd International Symposium on Sophisticated Car Occupant Safety Systems, Airbag 2000, Karlsruhe, Germany, 1994, pp. 42-1 to 42-9, the ignition energy must be supplied to the integrated circuit in the ignition system at the time of triggering. Consequently the available ignition energy, the triggering velocity and the triggering safety are diminished.

The published German Patent Applications DE 35 37 820 A1 and DE 196 53 115 A1 each present an ignition unit for igniting a pyrotechnical fuel pellet where not only an electrically ignitable igniter but also an ignition energy storage unit and an interlock unit are together integrated on a semiconductor chip, the interlock unit causing discharging of the energy storage unit via the electrical igniter by means of an unlocking signal. It is, however, not sufficient to use semiconductor capacitors for storing energy, at least for many igniters.

The integration of electrical components in a pyrotechnical ignition element is also described in German Patent Document DE 196 10 799 C1, wherein a printed-conductor structure is punched from a metal strip and bent three dimensionally. These printed conductors are fully enclosed by injection molding with a cuboidal carrier body, and subsequently, components can be inserted in recesses and connected to the printed conductors. The voluminous ignition energy capacitor is stowed in a space-saving manner in a cavity inside the carrier body. Also, an integrated circuit is provided for triggering. The module is then encased in a housing. The cost of manufacturing such an ignition element and the susceptibility to fault is very high on account of the filigreed construction.

Published German Patent Application DE 198 46 110 A1 shows the use of separate substrates (7, 8) as carrier elements for an ignition system with electrical components (9) that are arranged on both sides on the two substrates (7 and 8) arranged parallel to and at a distance from each other (compare, for instance, FIG. 1 and col. 2, line 45 ff.). In the interest of a space-saving construction, the components (9) situated on the two sides facing each other of the substrates (7 and 8) are placed extremely close together. A direct connection of these components (9) facing each other on the substrates (7, 8) is not disclosed, however, and would normally lead to an electrical defect or a short circuit.

SUMMARY OF THE INVENTION

The basic concept and object of the invention is to use an existing electrical component, having at least one flat external surface that at least in zones is itself non-conductive, as a carrier element for the other components of the integrated ignition circuit of a pyrotechnic ignition system and to locate the other components on this flat external surface. In view of the inventive solution, an otherwise usual additional carrier element in the form of a printed-circuit board or a cuboidal carrier element according to German Patent Document 196 10 799 C1, is not required. Thus, not only material but also space is saved, the manufacturing is simplified and hence reliability is enhanced.

According to the invention, a capacitor arrangement, such as the plate capacitor arrangement of an ignition capacitor, is particularly suitable as a carrier element for directly carrying other components in a most advantageous way because of the considerable size and the flat external surface thereof. Based on this, numerous further inventive developments result with respect to the arrangement and modification to the design of the printed-conductor structure and the ignition layer. Throughout this description, the term "printed-conductor structure" is used generally to refer to any conductor structure whether or not the conductor paths or traces are printed i.e. deposited conductors, or alternatively insertable metal strip conductors. Thus, with respect to the arrangement and embodiment of the design of the printed-conductor structure, a simple design is proposed wherein the conductors are actually formed by insertable metal parts in the housing, or for the printed-conductor structure to be vapor-deposited, precipitated or bonded on the housing or on external surfaces of the capacitor arrangement that are themselves non-conducting.

In conjunction with the housing, the insertable metal parts in turn permit an extremely compact and simple construction and can be used both for the connection between capacitor arrangement and circuit and even to the external terminals. In a particularly preferred further development, the external terminals can even be formed out of these insertable parts directly or integrally.

An arrangement of the printed-conductor structure on the carrier element permits the creation of contact zones that are linked to corresponding contact zones of the circuit. It is particularly advantageous to assemble circuits as components in the form of unpackaged semiconductor chips, so-called naked chips without a housing, or in flip-chip technology with their structured side that has contact zones facing downward on the printed-conductor structure. The printed-conductor structure can also be used on the lateral surfaces of the capacitor arrangement for linking up the individual capacitor electrodes or to establish a connection to other contact zones, with which the ignition system is connected via assigned or allocated contact elements, in the inside of the housing with an electronic triggering unit, for example a central unit of an occupant restraint system.

As regards the arrangement and embodiment of the design of the ignition layer, provision is made for it to be arranged on the carrier element, that is in particular on the capacitor arrange-ment in electrical connection with the printed conductors situated there, or alternatively an arrangement on the circuit or a modification to the design directly on this circuit, for instance as a silicon bridge igniter.

These variants relating to the arrangement and modifications to the design of the printed-conductor structure and the ignition layer are independent of each other and can therefore be combined at will.

Furthermore, extremely advantageous further developments are possible with respect to the design of the housing and the external terminals.

BRIEF DESCRIPTION OF THE DRAWINGS

In order that the invention may be clearly understood, it will now be described in connection with example embodiments, with reference to the accompanying drawings, wherein.

Figure 1:
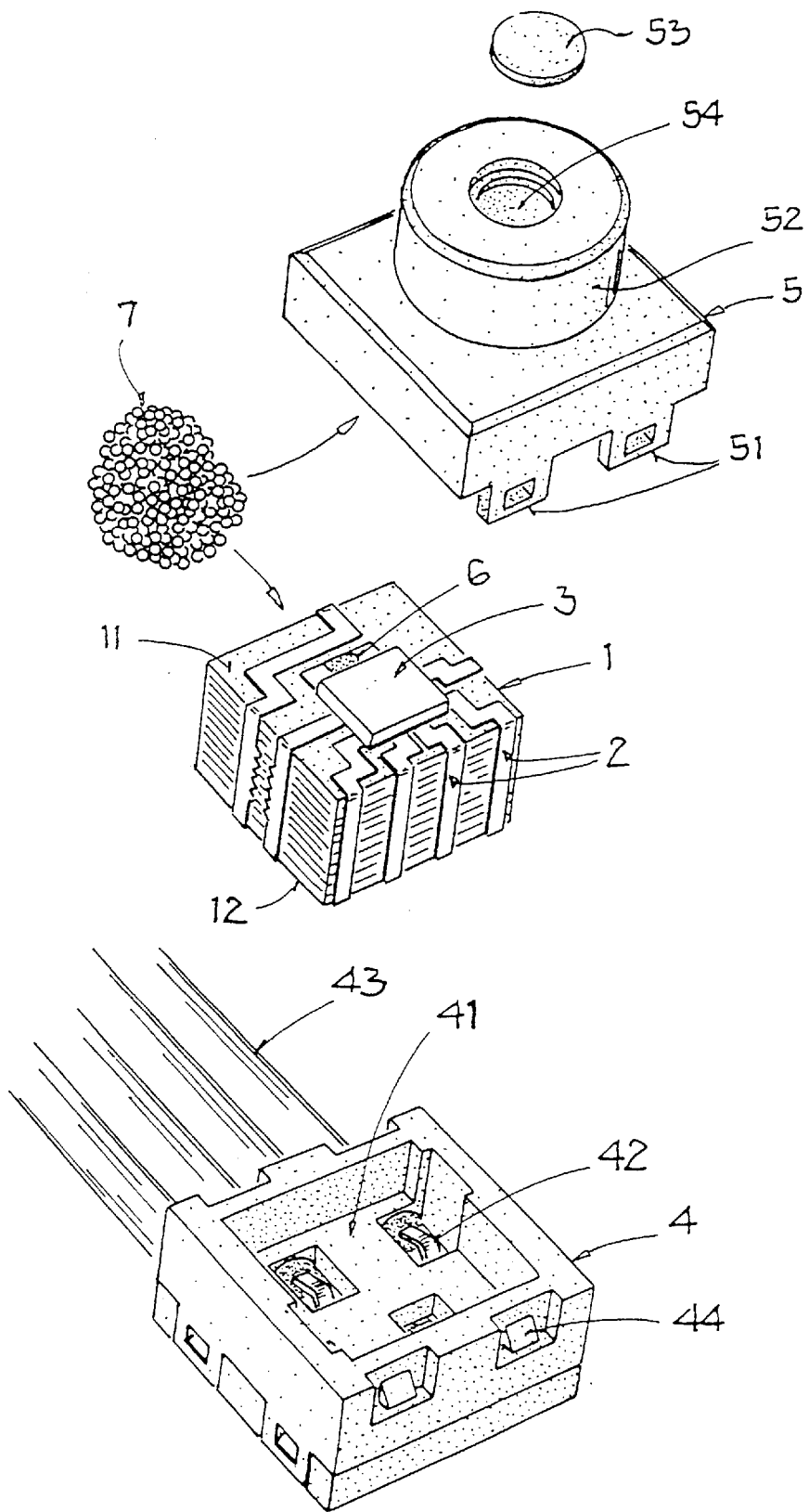
FIG. 1 is an exploded view of an assembly with a capacitor arrangement with printed conductors precipitated on it and components, as well as the housing, according to the invention.

DETAILED DESCRIPTION OF PREFERRED EXAMPLE EMBODIMENTS AND OF THE BEST MODE OF THE INVENTION

Each of the modifications or embodiments of the inventive arrangement shown in the Figures always incorporates the following basic components: a capacitor arrangement 1 having a cuboid or rectangular parallelogram shape, in particular an ignition capacitor in the form of a discrete electrical component, a printed-conductor structure i.e. a conductor structure 2 or 8 extending along at least two surfaces of the capacitor on two distinct planes, electrical components including in particular a circuit 3, a housing lower part 4, a housing upper part 5, an ignition layer 6 and a fuel charge 7. The basic components have respectively been given the same reference number in all Figures and details of these basic components have in general been designated by adding another digit.

FIG. 1 shows a disassembled or exploded view of a pyrotechnical ignition system as provided for use in, for example, gas generators of occupant restraint systems. The pyrotechnical ignition system comprises an ignition circuit consisting of a capacitor arrangement 1, in particular the ignition capacitor, printed-conductors 2, a circuit 3 and an ignition layer 6 which can be ignited by applying electrical energy thereto, whereupon the ignition of the layer 6 in turn ignites the separately shown fuel charge 7.

The carrier element used for the ignition circuit is the capacitor arrangement 1 and particularly at least one of the flat, self non-conductive external surfaces 11, 12, 13 thereof. In this example embodiment, not only the components but also the printed-conductor structure 2 is arranged on the external surfaces 11, 12, 13. The capacitor arrangement 1 is selected as the carrier element because this usually has flat non-conductive external surfaces 11, 12, 13 and the largest dimensions of all components. Furthermore, such a capacitor arrangement 1 is frequently made from dielectric material, for instance a ceramic plate capacitor, on which the printed conductors 2 can be placed particularly easily in known thin or thick film technology or alternatively by vapor-deposition.

Since the capacitor arrangement 1 consists at least of the ignition capacitor as a carrier element for the other components 3 and the printed conductors 2 are used, an extremely compact and small assembly results as can be seen in FIG. 1.

Figure 3:
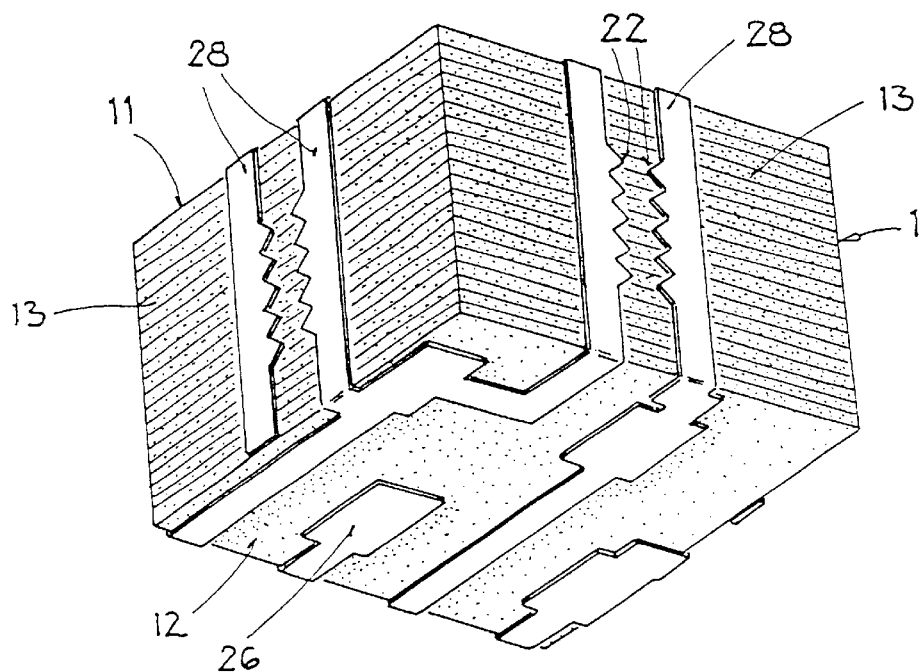
FIG. 3 is a perspective view of the lower side of the capacitor arrangement with contact zones to the housing lower part.

This ignition system is enclosed by a two-part housing 4, 5. The housing lower part 4 has not only elements 44 to assist joining to the housing upper part 5 but also a holding chamber 41 for the assembly and, in this example embodiment, tongue-shaped contact elements 42 over which the ignition system can be connected with a connecting cable 43. Furthermore, the capacitor arrangement 1 has contact zones 26 on the lower side 12 and these are shown in FIG. 3. A noteworthy feature here is that the contact elements 42 thus contact directly the contact zones 26 formed out of the printed-conductor structure so that no male/female connections or the like are needed. The contact elements 42 are here heat-sealed pressure-tight in the housing lower part 4 or are integrally molded in it.

Another preferred feature is for the ignition system to be enclosed pressure-tight by the housing 4, 5 in that it is inserted with dimensional accuracy into the holding chamber 41, 57 of the housing 4, 5 and locked there preferably by welded, soldered, pressed, crimped or bonded connections. On the one hand, the pressure-tightness protects the ignition system against external influences, especially moisture, but on the other hand it also permits pressure build-up on ignition that is deliberately relieved through an outflow opening 54, which is initially sealed by a pressure membrane 53, in the housing upper part 5.

Figure 2:
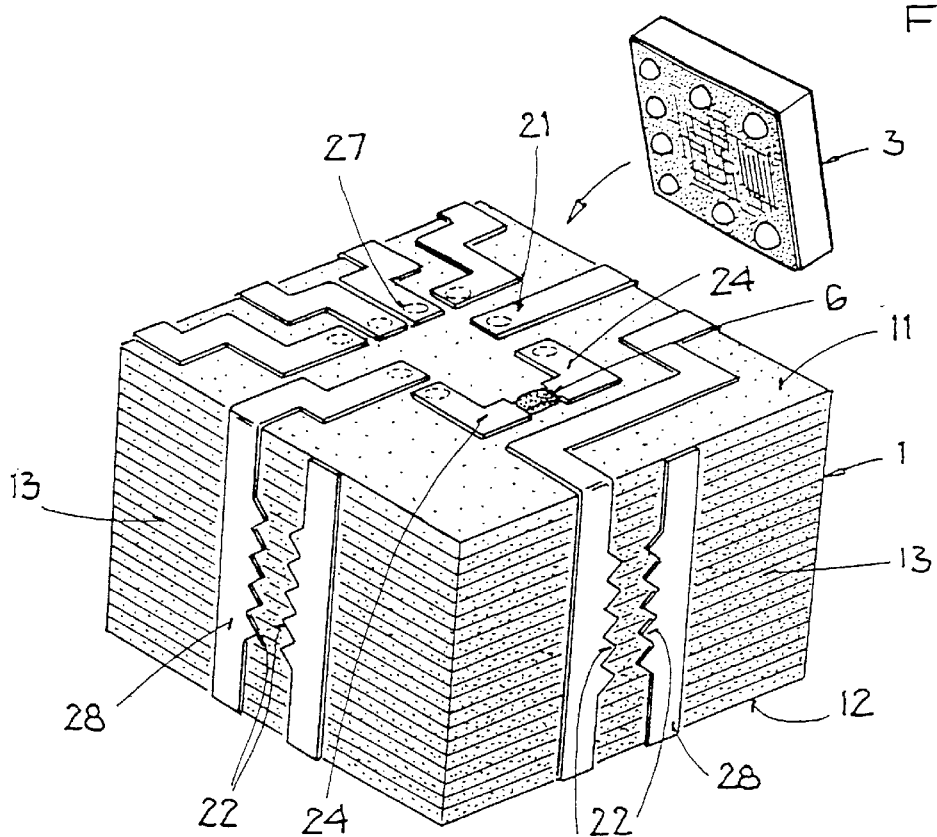
FIG. 2 is a perspective view of the upper side of the capacitor arrangement and the printed conductors, circuits and ignition layer arranged on it.

The example embodiments in FIGS. 1 to 5 have on the capacitor arrangement 1, printed conductors 21 which, in this example embodiment, connect not only the components 3 to each other and to the capacitor arrangement 1 but also the terminals 24 for the ignition layer 6 as well as the printed conductors 28 that are arranged on the lateral surfaces 13 of the capacitor arrangement 1, as can be seen in FIGS. 2 and 3. These electrically connect the elements situated on the upper side 11, namely printed conductors 21, components 3 and ignition layer 6 to contact zones 26 on the lower side 12 of the capacitor arrangement 1.

Where the components are concerned, for simplification only one circuit 3 is shown in each case in FIGS. 1 to 5. However, it is also easily possible to arrange several circuits and other components, such as resistors and the like, on the capacitor arrangement 1.

The housing upper part 5 incorporates the auxiliary joint elements 51 (made here, for instance, in the form of latching hooks and latching openings) assigned to the auxiliary joint elements 44 of the housing lower part 4, and also a fuel charge chamber 52 in which the fuel charge 7 of the ignition system is situated. The fuel charge chamber 52 has an outflow opening 54 which is initially closed by a pressure membrane 53. If the ignition layer 6 is activated and ignites the fuel charge 7, within the fuel charge chamber 52 a pressure builds up that tears open the pressure membrane 53, and hot burning fuel charge particles instantaneously flow under pressure through the outflow opening 54 into the gas generator as a result of which a naturally considerably greater fuel charge, optimized to the gas generation, is ignited.

The fuel charge chamber 52 is preferably protected from the holding chamber 41 for the capacitor arrangement 1 with the components by a separator 55 (see in particular FIG. 9) which has an opening 56 only in the region of the ignition layer 6.

For some of the fields or areas of application of these ignition systems, communication circuits should also be integrated in the housing 4, 5. For this purpose, these can be arranged either on the lower side 12 of the capacitor arrangement 1 facing away from the ignition layer 6 and fuel charge 7, or heat-resistant components and electrical connections with sufficient heat-resistance for this extremely short period of time can be used. In FIG. 1, such a communication circuit of this kind could, for instance, be integrated in the integrated circuit or IC 3 by designing it to be sufficiently protected, or pressure and heat-resistant. Substantial protection of the circuit is possible due to the substantial separator 55 between the ignition chamber 52 and the holding chamber 57/41 for the capacitor arrangement 1, as will be shown below in more detail in connection with the following Figures.

In addition, FIG. 2 shows the top side 11 of the ignition capacitor 1 with the contact zones 27 on which the IC 3 is placed, for instance by means of flip-chip technology.

The printed conductors 28 situated on the side of the capacitor arrangement 1 are particularly well protected against electro-static discharges even between themselves by means of spark bridge peaks 22, as can be seen in FIGS. 2 and 3. Furthermore, printed conductors 28 serve to connect the individual capacitor electrodes of the capacitor arrangement 1 to form a capacitor with several plates, as sketched in FIG. 4. Apart from energy storage, the capacitor arrangement 1 can also have many other functions; in particular, it can be made up of two capacitors electrically isolated from each other, of which one is connected as the ignition capacitor and the other as a protective capacitor against ESD, EMC and similar disturbances.

The sectional view in FIG. 4 illustrates once again the function of the printed conductors 28 arranged on the lateral surfaces 13 for connecting together the individual parallel capacitor plate foils 15, separated from one another by dielectric material, preferably ceramic plates 14, to form one or two capacitors.

Figure 4:
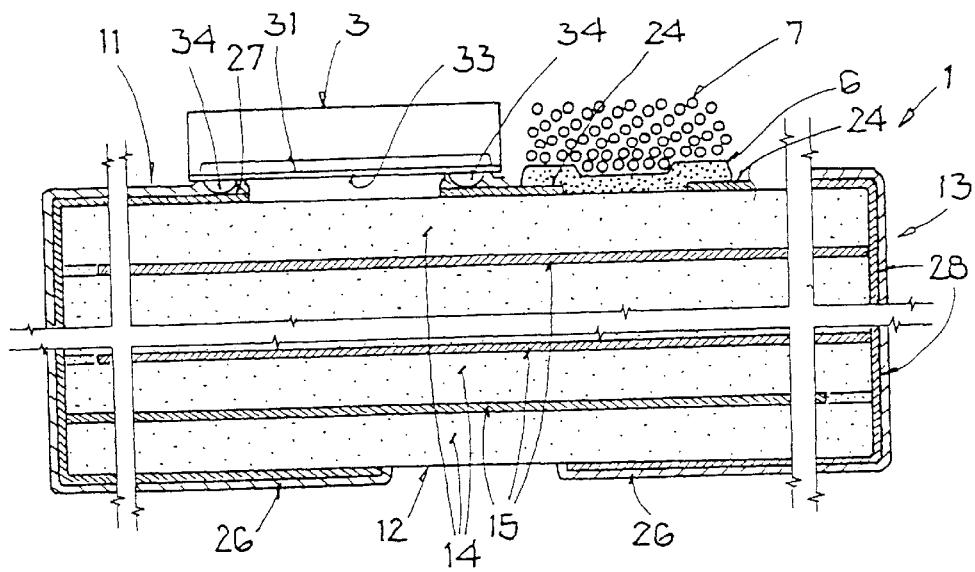
FIG. 4 shows a section through a modification of the design with an ignition layer on the surface of the ignition capacitor.
Figure 5:
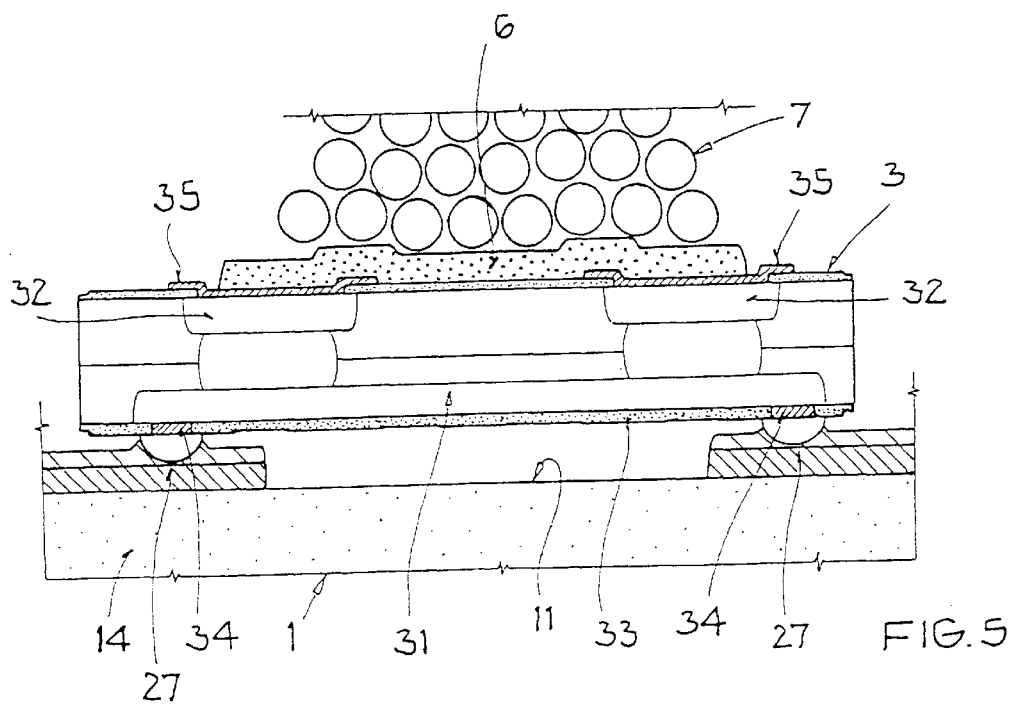
FIG. 5 shows a section through a modification of the design with an ignition layer on the surface of the integrated circuit.
Figure 6:
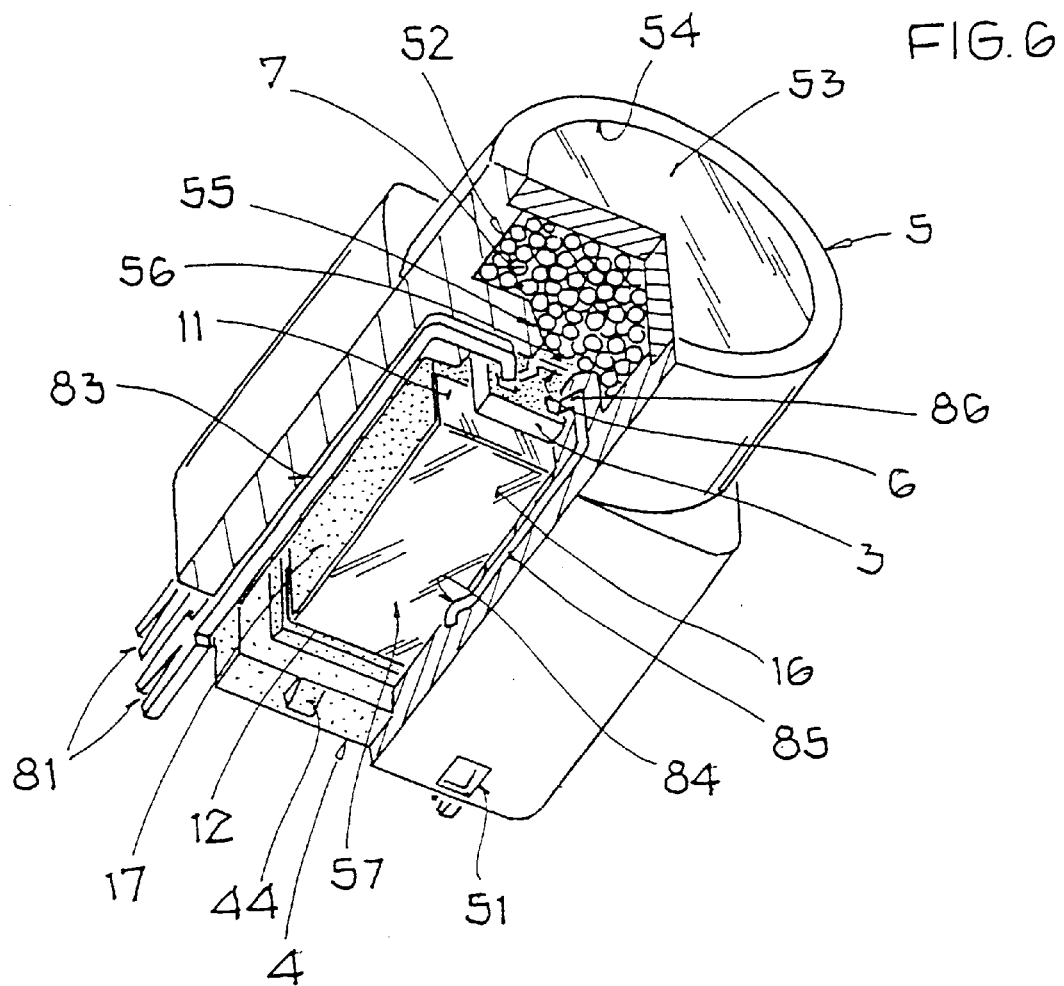
FIG. 6 is a broken-open or partially sectioned schematic view of a pyrotechnical ignition system with a capacitor arrangement in a housing, with a circuit mounted thereon, and with molded-in insertable parts in the housing.

In the section of the IC 3 shown in FIGS. 4 and 5, the active zone 31 in which the transistors and the like are integrated, as well as an insulation layer 33, made of silicon oxide for example, with contact zones 34, made of vapor-deposited aluminum for example, are aligned accordingly onto the assigned contact zones 27 on the capacitor arrangement 1, as indicated in the sketch.

The ignition medium in the example embodiment in FIG. 4 is shown as an ignition layer 6 that must be applied separately on the ignition bridge terminals 24, by thick-film technology for instance. This layer can also be made in one piece with the terminals from a suitable material, for instance from resistor material, doped silicon or the like.

In this Figure, the ignition bridge layer 6 is arranged alongside the IC 3 and, via printed conductors 21 and terminals 24 formed out from them (i.e. formed integrally as portions or extensions of the conductors), connected to the other components, in particular the IC 3 and the capacitor arrangement 1.

Alternatively, the ignition layer 6 can be arranged in or on the IC 3, as shown in FIG. 5. In this sketch too, the semiconductor structured active layer 31 and the insulation layer 33 are shown in sketch form only. In these, transverse connections 32 are provided from the upper side of the active layer 31 or from the insulation layer 33 to the terminals 35 for ignition layer 6 of the lower side of the IC 3 which is on top in the case of a face-down assembly. In this very case, however, the ignition layer 6 can also be included by doping in the substrate of the IC 3 that is made in the form of a naked chip and the terminals 35 can also be made in integrated form.

FIGS. 6 to 9 show further modifications to the inventive design or arrangement in which a conventional capacitor arrangement is used with a separate housing 17 and the printed-conductor structure 2 is formed by insertable metal parts 83, 85.

As in the preceding Figures, the capacitor arrangement 1 is again arranged in a holding chamber of the housing, here situated in the housing upper part 5 and designated by reference number 57. Circuit 3 is arranged on a non-conductive external surface of this capacitor arrangement 1.

The capacitor arrangement 1 is of conventional design, i.e. as a standard type of capacitor with its own housing 17. The advantage of this variant is that, as opposed to the capacitor arrangement shown in FIGS. 1 to 5 and provided with printed-conductor structures, a very low-cost standard capacitor can now be used, on which the components, especially the circuit 3, are arranged and, for example, bonded.

Figure 7:
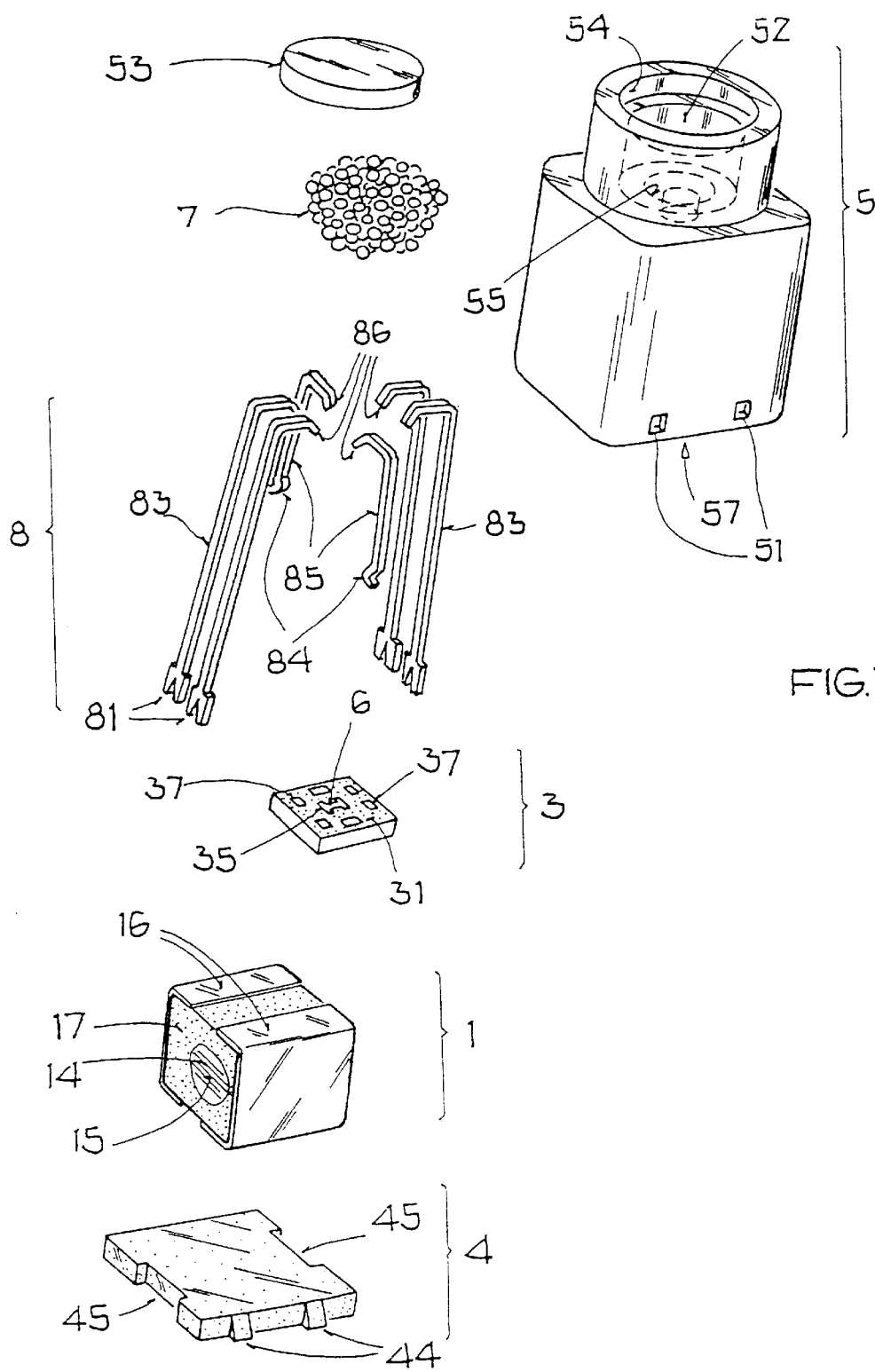
FIG. 7 is an exploded view of the modification of the design shown in FIG. 6.
Figure 8:
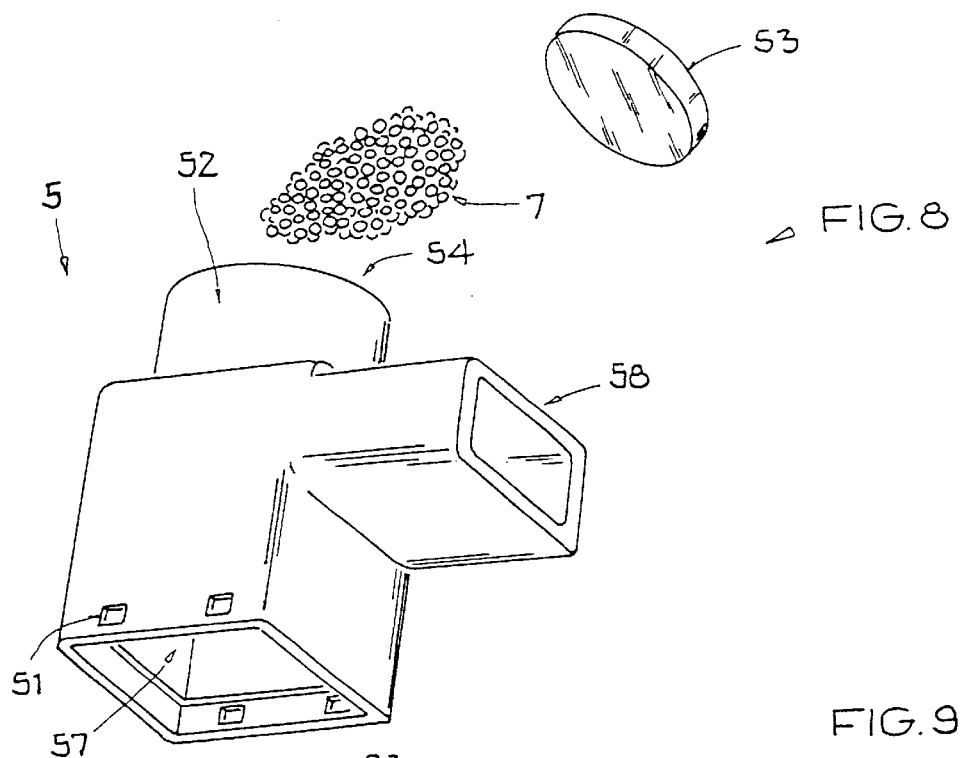
FIG. 8 is an exploded view of another modification of the design, also with a printed-conductor structure formed by insertable parts.

The capacitor arrangement 1 in this example covers only the ignition capacitor function and has two electrical contact surfaces 16 that are insulated from each other, for example on the lateral surfaces, over which the capacitor electrodes are connected on the inside. The housing 17 of the capacitor arrangement 1 is formed, for example, by an all-around injection molding with insulating material. The electrical contact surfaces 16 can also be drawn or extended onto the upper side of the capacitor arrangement 1 directed toward the circuit 3, as shown in FIG. 7, so that the capacitor arrangement 1 is also connected directly to the lower side of the circuit 3 through contact zones 34 (see FIG. 8, comparable to those in FIG. 4), so that the insertable parts 85 provided for this in FIGS. 6, 7 and 9 can be omitted. These contact zones 34 on the lower side of the circuit 3 could be connected to the upper side of the circuit 3 over plated-through holes similar to those with reference numbers 32 in FIG. 5 or by means of conductors placed on the outside along circuit 3. If the individual plates of the capacitor arrangement are perpendicular to the housing lower part 4 then, for instance, it would be possible for only that contact surface 16 which is directed toward the circuit 3 to be attached mechanically and also contacted electrically over a substrate terminal on circuit 3, for example by soldering or by means of a conductive bonding agent.

The housing upper part 5 is closed by attaching a housing lower part 4 by means of auxiliary joint elements 44, 51 which latch together and secure the two housing parts 4, 5. Separated from the holding chamber 57 preferably by a separator 55, there is the fuel charge chamber 52 with the fuel charge 7. The separator 55 has an opening 56 in the region of the ignition layer 6 allowing the ignition layer 6 to ignite the fuel charge 7. The fuel charge chamber 52 in turn has an outflow opening 54 which is initially closed, for example towards a gas generator of an airbag not shown in the drawing, by a pressure cover or membrane 53. The compactness of the ignition system is in turn based on the fundamental arrangement of the components, especially of the circuit 3, directly on the capacitor arrangement 1.

The insertable parts 83, 85 are preferably punched in one piece from a metal strip, bent into the required shape and fixed in the material of the housing upper part 5 by all-around injection molding, whereby the contact zones 81, 82, 84, 86 remain free at the ends of the insertable parts. For the insertable parts 83, one end thereof is taken into the extreme end of the housing where it is formed as insulation piercing connector contacts 81 in FIGS. 6, 7 for direct contacting of an insulated cable, or as terminal posts 82 in FIGS. 8, 9 for contacting with a connector that is not specified in further detail. Furthermore, in FIG. 9 the insertable parts 85 belonging to the capacitor arrangement 1 are also provided with the contacts 84 directed towards the electrical contact surfaces 16 of the housed capacitor arrangement. These insertable parts 85 are replaced in FIG. 8 by the direct electrical contact of the contact zones 34 of the circuit 3 with the contact surfaces 16 of the capacitor arrangement 1.

The other ends 86 of the insertable parts 83 and 85 each contact the circuit 3, e.g. at contact zones 37 as shown in FIG. 7. The particular form given to the inner contact ends 86 and 84 also deserves special mention because these are preferably designed in such a way that they are spring-elastic and project from the housing such that, on introducing the capacitor arrangement 1 with the circuit 3 arranged on it into the housing upper part 5 and on closing the housing with the housing lower part 4, the capacitor arrangement 1 is pressed together with the circuit 3 arranged on it against the contact ends 86 and 84 of the insertable parts 83, 85.

This ensures not only mechanical location but also a reliable electrical contact. Apart from another modification of the external contact ends as pins 82 in a connector zone 58 of the housing upper part 5, the FIGS. 8 and 9 also reveal as a special feature a contact foil 36, for example with a local application of conductive bonding agent. When the contact foil 36 is placed over the circuit 3 the contact between this and the inner contact ends 86 and 84 of the insertable parts 83, 85 is improved.

Figure 9:
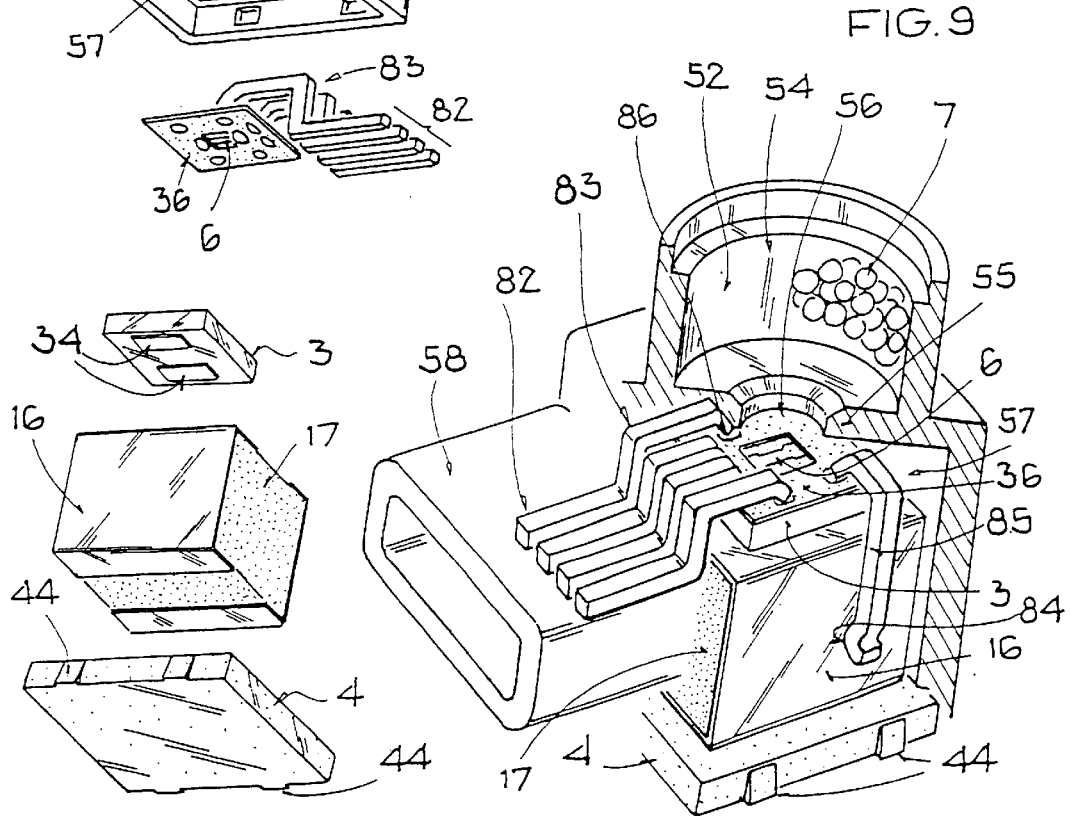
FIG. 9 is a schematic, partially sectioned sketch of a completed assembly with a connector contact zone and with visualization of the pyrotechnical ignition system arranged in it.

This contact foil 36 either has itself an ignition layer 6, as in FIG. 8, or it has a recess for the ignition layer 6 beneath it, as in FIG. 9.

The ignition layer 6 can in principle be situated both on the circuit 3 and on the capacitor arrangement 1, as was already explained with respect to the example embodiments in FIGS. 4 and 5.

The insertable parts 83, 85 can be attached to the inside of the housing or they can be provided on the surface of the holding chamber 57 in the form of metal conductors.

The housing parts 4 and 5 are joined together preferably pressure and moisture tight. The housing lower part 4 in FIGS. 6 and 7 has recesses 45 for allowing the insertable parts 85 to be passed through and is filled for sealing purposes by, for example, a pourable compound.

The separator 55 between the fuel charge chamber 52 and the holding chamber 57 for the capacitor arrangement 1 with the circuit 3 can be seen particularly well in FIG. 9. The separator 55 can be made as a single piece with the housing upper part 5 which can be manufactured, for example, by heat-resistant plastic injection molding. The separator 55 is provided to protect the circuit 3 against the effects of temperature and pressure when the fuel charge 7 burns in an explosive manner. The separator 55 is interrupted only by an opening 56 immediately above the ignition layer 6 so that ignition of the ignition layer 6 can ignite the fuel charge 7.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A pyrotechnical ignition system with an integrated ignition circuit, comprising:

a housing;

an ignition medium that is arranged and adapted to be ignited by an ignition voltage applied thereto;

a pyrotechnical fuel charge that is arranged and adapted to be ignited by said ignition medium when said ignition medium is ignited;

a discrete first electrical circuit component that is adapted to participate in generating, storing or controlling said ignition voltage, that is arranged in said housing, and that has a cuboid shape with plural flat external surfaces of which at least a partial surface area is non-conductive;

a discrete second electrical circuit component adapted to participate in generating, storing or controlling said ignition voltage, that is arranged and carried on one of said flat external surfaces of said first electrical circuit component in said housing; and a conductor structure that extends along at least two of said flat external surfaces on at least two planes at an angle relative to each other, and that electrically connects said first and second electrical circuit components with each other within said housing and with said ignition medium to provide said ignition voltage to said ignition medium.

2. The pyrotechnical ignition system according to claim 1, in combination with other components making up a vehicle occupant restraint system.

3. The pyrotechnical ignition system according to claim 1, wherein said first electrical circuit component is a capacitor arrangement, and said second electrical circuit component is an electronic integrated circuit.

4. The pyrotechnical ignition system according to claim 3, wherein said capacitor arrangement is an ignition capacitor arrangement adapted to store an ignition energy to provide said ignition voltage, and is connected via said conductor structure so as to be adapted to provide said ignition voltage to said ignition medium.

5. The pyrotechnical ignition system according to claims 3, wherein said capacitor arrangement comprises two capacitors that are electrically separated from each other, and wherein said two capacitors include an ignition capacitor that is adapted and connected to store an ignition energy and provide therefrom said ignition voltage, and a protective capacitor adapted to provide protection against electrical disturbances.

6. The pyrotechnical ignition system according to claim 1, wherein said conductor structure comprises metal conductor parts inserted in said housing.

7. The pyrotechnical ignition system according to claim 1, wherein said conductor structure comprises metal conductor parts in said housing, wherein said second electrical circuit component includes contact zones formed on a surface thereof facing away from said first electrical component, wherein said metal conductor parts each include first and second contact ends, wherein said first contact ends of said metal conductor parts contact said contact zones, and wherein at least some of said second contact ends of said metal conductor parts are each respectively in contact with said first electrical circuit component.

8. The pyrotechnical ignition system according to claim 1, wherein said conductor structure comprises metal conductor parts in said housing, wherein said first electrical circuit component is a capacitor arrangement comprising a standard discrete capacitor in a discrete capacitor housing, which has said flat external surfaces and further has electrical contact surfaces, wherein said second electrical component is a discrete electronic circuit component, and wherein said metal conductor parts connect said discrete electronic circuit component to said electrical contact surfaces.

9. The pyrotechnical ignition system according to claim 1, wherein said conductor structure comprises printed-circuit conductors that are at least one of vapor-deposited, precipitated and bonded at least in part on said partial surface area of said first electrical circuit component that is non-conductive.

10. The pyrotechnical ignition system according to claim 9, wherein said printed-circuit conductors include respective integrally formed first contact zones on said first electrical circuit component, and wherein said second electrical circuit component includes second contact zones thereon which are in contact respectively with said first contact zones.

11. The pyrotechnical ignition system according to claim 10, wherein said second electrical component comprises an electronic circuit chip arranged and connected in a flip-chip technology on said first electrical component via said second contact zones.

12. The pyrotechnical ignition system according to claim 9, wherein said printed-circuit conductors respectively include at least one of a spark gap structure including electrostatic discharge bridge peaks and an electrical discharging resistor, which is adapted to discharge electrostatic charges.

13. The pyrotechnical ignition system according to claim 1, wherein said ignition medium comprises an ignition layer of said ignition medium that is arranged on an upper surface of said second electrical circuit component.

14. The pyrotechnical ignition system according to claim 13, wherein contact zones that electrically contact said ignition layer are provided on said upper surface of said second electrical circuit component and are electrically insulated from each other while being connected together by said ignition layer.

15. The pyrotechnical ignition system according to claim 13, wherein said ignition layer is configured and arranged as a semiconductor bridge igniter, wherein said second electrical circuit component comprises an unpackaged electronic circuit having conductive doped zones on said upper surface thereof, wherein said conductive doped zones are insulated from each other and contact said ignition layer.

16. The pyrotechnical ignition system according to claim 1, wherein said ignition medium comprises an ignition layer of said ignition medium that is arranged on said first electrical circuit component, and said conductor structure integrally includes contact zones that directly electrically contact said ignition layer.

17. The pyrotechnical ignition system according to claim 1, wherein said housing encloses said first electrical circuit component and said second electrical circuit component in a pressure-tight manner, for which said housing includes a welded, soldered, pressed, crimped or bonded joint.

18. The pyrotechnical ignition system according to claim 1, wherein said conductor structure comprises metal conductor parts embedded at least partially in said housing.

19. The pyrotechnical ignition system according to claim 1, wherein said conductor structure comprises metal conductor parts in said housing, wherein said second electrical circuit component includes contact zones formed on a surface thereof facing away from said first electrical component, wherein said metal conductor parts each include first and second contact ends, wherein said first contact ends of said metal, conductor parts contact said contact zones, and wherein said second contact ends of said metal conductor parts are each respectively configured as an external terminal end that is exposed externally from said housing.

20. A pyrotechnical ignition system comprising:
a housing;
an ignition medium arranged in said housing; and
an ignition circuit including a discrete capacitor as a discrete circuit component, an integrated circuit, and a conductor structure, arranged in said housing;
wherein:
said discrete capacitor has a cuboid shape with plural flat free external surfaces, and is adapted to store an electrical ignition energy;
said integrated circuit is mounted and carried directly on one of said flat free external surfaces of said discrete capacitor;
said conductor structure extends along at least two of said flat free external surfaces of said capacitor on at least two planes at an angle relative to each other, and is electrically connected to said capacitor, said integrated circuit and said ignition medium so as to selectively apply an ignition voltage arising from said ignition energy to said ignition medium under control of said integrated circuit; and
said ignition medium is adapted to ignite upon application of said ignition voltage thereto.

21. The pyrotechnical ignition system according to claim 20, wherein said conductor structure comprises conductor paths that are arranged directly on said external surface of said capacitor and that electrically connect said capacitor with said integrated circuit.

22. The pyrotechnical ignition system according to claim 20, wherein said conductor structure comprises metal conductor members that are at least partly embedded and held in said housing, and that electrically connect said capacitor with said integrated circuit.

23. The pyrotechnical ignition system according to claim 20, wherein said ignition medium is arranged directly on said external surface of said capacitor.

24. The pyrotechnical ignition system according to claim 20, wherein said ignition medium is arranged on a surface of said integrated circuit.

25. A pyrotechnical ignition system with an integrated ignition circuit, comprising:
   a housing;
   an ignition medium that is arranged and adapted to be ignited by an ignition voltage applied thereto;
   a pyrotechnical fuel charge that is arranged and adapted to be ignited by said ignition medium when said ignition medium is ignited;
   a first electrical circuit component adapted to participate in generating, storing or controlling said ignition voltage, that is arranged in said housing, and that has at least one flat external surface of which at least a partial surface area is non-conductive;
   a second electrical circuit component adapted to participate in generating, storing or controlling said ignition voltage, that is arranged and carried on said flat external surface of said first electrical circuit component in said housing; and
   a conductor structure that comprises metal conductor parts in said housing, and that electrically connects said first and second electrical circuit components with each other within said housing and with said ignition medium to provide said ignition voltage to said ignition medium; and
   wherein said second electrical circuit component includes contact zones formed on a surface thereof facing away from said first electrical component, wherein said metal conductor parts each include first and second contact ends, wherein said first contact ends of said metal conductor parts contact said contact zones, and wherein at least some of said second contact ends of said metal conductor parts are each respectively in contact with said first electrical circuit component.

26. The pyrotechnical ignition system according to claim 25, wherein said metal conductor parts are arranged and secured in said housing by all-around injection molding.

27. The pyrotechnical ignition system according to claim 26, wherein said housing comprises a first housing part and a second housing part which defines a holding chamber therein, said first and second electrical circuit components are arranged in said holding chamber, at least certain ones of said first and second contact ends protrude from said second housing part into said holding chamber, and said first housing part pushes said first electrical circuit component with said second electrical circuit component arranged thereon against said certain ones of said first and second contact ends.

28. The pyrotechnical ignition system according to claim 27, wherein said certain ones of said first and second contact ends are spring-elastic flexible contact ends.

29. The pyrotechnical ignition system according to claim 27, further comprising at least one of a conductive bonding agent and a reflow-soldered solder arranged to provide an electrical connection respectively between said first contact ends and said contact zones.

30. The pyrotechnical ignition system according to claim 27, further comprising a flexible film having at least one of a conductive bonding agent and reflow-soldered solder on two opposite major surfaces of said flexible film and having electrical connections between said opposite major surfaces, wherein said flexible film is arranged interposed between said first contact ends and said contact zones on said second electrical circuit component.

31. The pyrotechnical ignition system according to claim 30, wherein said ignition medium is configured as an ignition medium layer on said flexible film on said second electrical circuit component.

32. The pyrotechnical ignition system according to claim 25, wherein at least some of said second contact ends are configured as external terminal ends that integrally protrude from respective ones of said metal conductor parts to be exposed externally from said housing.

33. The pyrotechnical ignition system according to claim 32, wherein said external terminal ends are configured as insulation piercing connector contacts.

34. The pyrotechnical ignition system according to claim 33, wherein said external terminal ends are configured as terminal posts.

35. A pyrotechnical ignition system with an integrated a ignition circuit, comprising:
   a housing;
   an ignition medium that is arranged and adapted to be ignited by an ignition voltage applied thereto;
   a pyrotechnical fuel charge that is arranged and adapted to be ignited by said ignition medium when said ignition medium is ignited;
   a first electrical circuit component adapted to participate in generating, storing or controlling said ignition voltage, that is arranged in said housing, and that has at least one flat external surface of which at least a partial surface area is non-conductive;
   a second electrical circuit component adapted to participate in generating, storing or controlling said ignition voltage, that is arranged and carried on said flat external surface of said first electrical circuit component in said housing;
   a conductor structure that electrically connects said first and second electrical circuit components with each other within said housing and with said ignition medium to provide said ignition voltage to said ignition medium, wherein said conductor structure comprises printed-circuit conductors that are at least one of vapor-deposited, precipitated and bonded at least in part on said partial surface area of said first electrical circuit component that is non-conductive;
   an electronic trigger unit arranged outside of said housing; and
   an electrical link that is electrically connected to said electronic trigger unit and that includes contact elements arranged inside said housing and contacting respective portions of said printed-circuit conductors.

36. A pyrotechnical ignition system with an integrated ignition circuit, comprising:
   a housing;
   an ignition medium that is arranged and adapted to be ignited by an ignition voltage applied thereto;
   a pyrotechnical fuel charge that is arranged and adapted to be ignited by said ignition medium when said ignition medium is ignited;
   a first electrical circuit component adapted to participate in generating, storing or controlling said ignition voltage, that is arranged in said housing, and that has at least one flat external surface of which at least a partial surface area is non-conductive, wherein said first electrical circuit component comprises a plate capacitor arrangement including a plurality of dielectric insulating plates and a plurality of metal capacitor electrodes that have been precipitated at least on part of said dielectric insulating plates;

a second electrical circuit component adapted to participate in generating, storing or controlling said ignition voltage, that is arranged and carried on said flat external surface of said first electrical circuit component in said housing;

a conductor structure that electrically connects said first and second electrical circuit components with each other within said housing and with said ignition medium to provide said ignition voltage to said ignition medium, wherein said conductor structure comprises printed-circuit conductors that are at least one of vapor-deposited, precipitated and bonded at least in part on said partial surface area of said first electrical circuit component that is non-conductive, and wherein said printed-circuit conductors at least partly have been deposited and extend along at least one respective outermost one of said dielectric insulating plates parallel to a major plane of said plates; and lateral printed conductors provided on side surfaces of said capacitor arrangement perpendicular to said major plane of said plates, wherein said lateral printed conductors respectively interconnect respective individual ones of said capacitor electrodes so as to form thereof a capacitor and respectively connect said capacitor to said second electrical circuit component.

37. A pyrotechnical ignition system with an integrated ignition circuit, comprising:

a housing;

an ignition medium that is arranged and adapted to be ignited by an ignition voltage applied thereto;

a pyrotechnical fuel charge that is arranged and adapted to be ignited by said ignition medium when said ignition medium is ignited;

a first electrical circuit component adapted to participate in generating, storing or controlling said ignition voltage, that is arranged in said housing, and that has at least one flat external surface of which at least a partial surface area is non-conductive;

a second electrical circuit component adapted to participate in generating, storing or controlling said ignition voltage, that is arranged and carried on said flat external surface of said first electrical circuit component in said housing; and a conductor structure that electrically connects said first and second electrical circuit components with each other within said housing and with said ignition medium to provide said ignition voltage to said ignition medium;

said housing has a holding chamber and a fuel charge chamber therein with a separator arranged between and substantially separating said holding chamber and said fuel charge chamber, said first and second electrical circuit components and said ignition medium are arranged in said holding chamber, said fuel charge is arranged in said fuel charge chamber, said separator is continuous and closed except for an opening therein that communicates from said holding chamber to said fuel charge chamber directly adjacent to said ignition medium and said fuel charge so that said fuel charge can be ignited by said ignition medium through said opening when said ignition medium is ignited.

* * * * *